United States Patent
Balb et al.

(12)

(10) Patent No.: US 11,775,378 B2
(45) Date of Patent: Oct. 3, 2023

(54) MEMORY HEALTH STATUS REPORTING

(71) Applicant: Micron Technology, Inc., Boise, ID (US)

(72) Inventors: Markus Balb, Ottobrunn (DE); Thomas Hein, Munich (DE); Heinz Hoenigschmid, Poecking (DE)

(73) Assignee: Micron Technology, Inc., Boise, ID (US)

( * ) Notice: Subject to any disclaimer, the term of this patent is extended or adjusted under 35 U.S.C. 154(b) by 44 days.

(21) Appl. No.: 17/118,455

(22) Filed: Dec. 10, 2020

(65) Prior Publication Data

US 2021/0182141 A1 Jun. 17, 2021

Related U.S. Application Data

(60) Provisional application No. 62/948,737, filed on Dec. 16, 2019.

(51) Int. Cl.
*G01R 31/3185* (2006.01)
*G06F 11/07* (2006.01)
(Continued)

(52) U.S. Cl.
CPC ...... *G06F 11/0793* (2013.01); *G01R 31/3177* (2013.01); *G06F 3/0619* (2013.01);
(Continued)

(58) Field of Classification Search
CPC .. G06F 11/0793; G06F 3/0619; G06F 3/0653; G06F 3/0659; G06F 3/0673;
(Continued)

(56) References Cited

U.S. PATENT DOCUMENTS 10,389,414 B1 * 8/2019 Qi ................... H02J 50/40
2004/0243978 A1 * 12/2004 Walmsley ............ G06F 21/74
717/174

(Continued)

FOREIGN PATENT DOCUMENTS

DE         0636976 A1 *  2/1995
KR      20120052303 A    5/2012

OTHER PUBLICATIONS

ISA/KR, International Search Report and Written Opinion of the International Searching Authority, Int'l Appl. No. PCT/US2020/064537, dated Apr. 1, 2021, Korean Intellectual Property Office, Seo-gu, Daejeon, Republic of Korea, 12 pgs.

*Primary Examiner* — Albert Decady
*Assistant Examiner* — Enam Ahmed
(74) *Attorney, Agent, or Firm* — Holland & Hart LLP

(57) ABSTRACT

Methods, systems, and devices for memory health status reporting are described. A memory device may output to a host device a parameter value, which may be indicative of metric or condition related to the performance or reliability (e.g., a health status) of the memory device of the memory device. The host device may thereby determine that the memory device is degraded, possibly prior to device or system failure. Based on the parameter value, the host device may take preventative action, such as quarantining the memory device, deactivating the memory device, or swapping the memory device for another memory device.

20 Claims, 8 Drawing Sheets

(51) Int. Cl.
*G01R 31/3177* (2006.01)
*G06F 3/06* (2006.01)
*G06F 11/10* (2006.01)
*G06F 11/30* (2006.01)
*G11C 29/02* (2006.01)
*G11C 29/12* (2006.01)

(52) U.S. Cl.
CPC .......... *G06F 3/0653* (2013.01); *G06F 3/0659* (2013.01); *G06F 3/0673* (2013.01); *G06F 11/0727* (2013.01); *G06F 11/0754* (2013.01); *G06F 11/0772* (2013.01); *G06F 11/1072* (2013.01); *G06F 11/3037* (2013.01); *G11C 29/028* (2013.01); *G11C 29/1201* (2013.01); *G01R 31/318597* (2013.01)

(58) Field of Classification Search
CPC ............. G06F 11/0727; G06F 11/0754; G06F 11/0772; G06F 11/1072; G06F 11/3037; G06F 3/0683; G06F 11/004; G06F 11/073; G06F 11/1048; G06F 11/3058; G06F 11/3055; G01R 31/3177; G01R 31/318597; G11C 29/028; G11C 29/1201; G11C 2029/4402; G11C 29/52; G11C 29/78; G11C 7/04; G11C 2029/0409; G11C 2029/0411; G11C 29/42; G11C 29/4401; G11C 29/48; Y02D 10/00

USPC ........................................................ 714/710
See application file for complete search history.

(56) References Cited

U.S. PATENT DOCUMENTS

| | | | |
|---|---|---|---|
| 2007/0106834 A1* | 5/2007 | Murin .................... | G11C 16/26 711/103 |
| 2009/0077434 A1* | 3/2009 | Furuhjelm ............. | G11C 16/349 714/E11.055 |
| 2010/0095168 A1* | 4/2010 | Jeddeloh ................ | G11C 29/12 714/720 |
| 2010/0180061 A1* | 7/2010 | Toshimitsu ........... | G06F 13/385 710/305 |
| 2011/0035565 A1 | 2/2011 | Barrall | |
| 2012/0117304 A1 | 5/2012 | Worthington et al. | |
| 2012/0324321 A1* | 12/2012 | Chowdhury .......... | H03M 13/09 714/E11.032 |
| 2013/0036254 A1 | 2/2013 | Fai et al. | |
| 2013/0159797 A1* | 6/2013 | Peng .................... | G11C 16/349 714/E11.001 |
| 2014/0122777 A1* | 5/2014 | Oh ........................ | G06F 3/0679 711/103 |
| 2016/0085612 A1* | 3/2016 | Liu ........................ | G06F 11/073 714/6.13 |
| 2016/0342471 A1* | 11/2016 | Zhang .................... | G06F 3/064 |
| 2017/0345510 A1* | 11/2017 | Achtenberg ........ | G06F 11/1048 |
| 2018/0067890 A1* | 3/2018 | Espeseth ................ | G06F 13/24 |
| 2020/0151040 A1* | 5/2020 | Lee ..................... | G06F 11/3034 |

* cited by examiner

MEMORY HEALTH STATUS REPORTING

CROSS REFERENCE

The present Application for Patent claims the benefit of U.S. Provisional Patent Application No. 62/948,737, by BALB et al., entitled "MEMORY HEALTH STATUS REPORTING," filed Dec. 16, 2019, assigned to the assignee hereof, and expressly incorporated by reference herein.

BACKGROUND

The following relates generally to one or more memory systems and more specifically to memory health status reporting.

Memory devices are widely used to store information in various electronic devices such as computers, wireless communication devices, cameras, vehicles, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

In some cases, it may be desirable for a memory device to provide a status to a host device indicating how well the memory device is operating (i.e., a health status). Such a status may be useful in high-reliability applications, such as automotive applications, where real-time or other proactive status updates of the memory device may prevent or mitigate adverse outcomes (e.g., getting in a crash). For instance, the host device may determine, based on the health status, that the memory device is degraded or that a risk of failure is heightened prior to failure occurring. As such, preventative action may be undertaken (e.g., the memory device may be quarantined, deactivated, or swapped for another memory device), which may delay or prevent failure.

In some examples, the health status may include an indication of a parameter value of the memory device. The indication of the parameter value may be an operability status of a memory device (e.g., an indication of whether the memory device is or is not operable), a voltage of the memory device, a phase lock loop (PLL) status of the memory device, a temperature of the memory device, a status of a fuse (or antifuse) internal to the memory device, a rate of error corrections performed by the memory device, or any other status or operating condition information related to the occurrence or likelihood of an error or failure condition, or any combination of such information. In some cases, the memory device may indicate the parameter value without an explicit request from the host device. For instance, the memory device may indicate parameter value if the parameter value crosses a threshold. Additionally or alternatively, the memory device may indicate the parameter value according to a scheduled basis, which may be preconfigured at the memory device or may be indicated by the host device. Additionally or alternatively, the host device may transmit an explicit request (e.g., may poll the memory device) for the health status to the memory device.

Features of the disclosure are initially described in the context of memory systems and dies as described with reference to FIGS. 1 and 2. Features of the disclosure are described in the context of a system configuration and a memory system component diagram as described with reference to FIGS. 3-4. These and other features of the disclosure are further illustrated by and described with reference to an apparatus diagram and flowcharts that relate to memory health status reporting as described with references to FIGS. 5-8.

Figure 1:
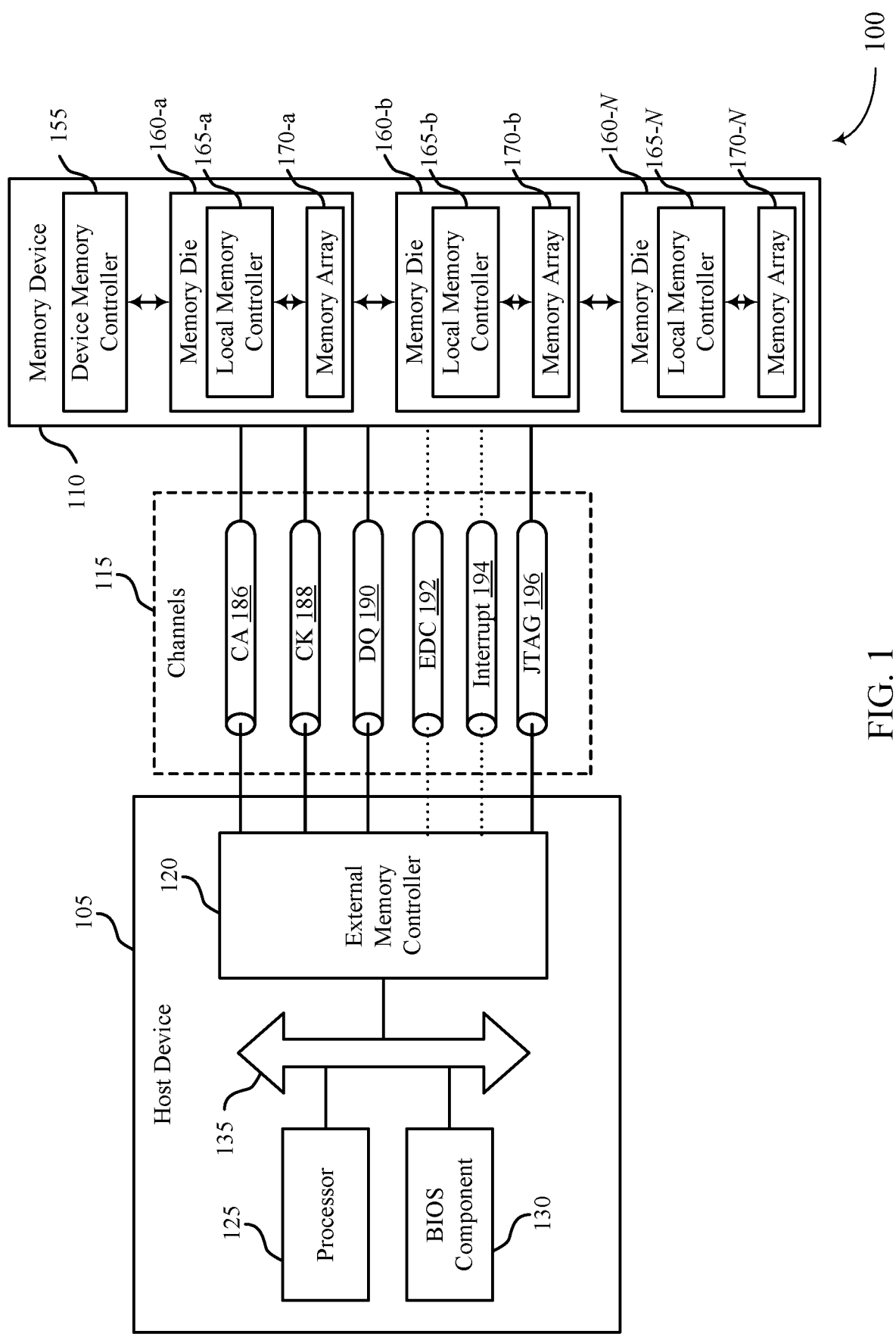
FIG. 1 illustrates an example of a system that supports memory health status reporting in accordance with examples as disclosed herein.

FIG. 1 illustrates an example of a system 100 that utilizes one or more memory devices in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device (e.g., a graphics processing unit (GPU)), a computer, a laptop computer, a tablet computer, a smartphone, a cellular phone, a wearable device, an internet-connected device, or some other stationary or portable electronic device, among other examples. In some examples, the host device 105 may refer to the hardware, firmware, software, or any combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device may be in coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or any combination of these components. In such examples, the processor 125 may be an example of a central processing unit (CPU), a graphics processing unit (GPU), a general purpose GPU (GPGPU), or a system on a chip (SoC), among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may be operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or any combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more error detection code (EDC) channels, one or more interrupt channels 194, and one or more other Joint Test Action Group (JTAG) channels 196, or any combination thereof. In some examples, may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, the channels 115 may include one or more command and address (CA) channels 186. The CA channels 186 may be operable to communicate commands between the host device 105 and the memory device 110 including control information associated with the commands (e.g., address information). For example, the CA channel 186 may include a read command with an address of the desired data. In some examples, a CA channel 186 may include any quantity of signal paths to decode one or more of address or command data (e.g., eight or nine signal paths).

In some examples, the channels 115 may include one or more clock signal channels 188 (e.g., CK channels). The clock signal channels 188 may be operable to communicate one or more clock signals between the host device 105 and the memory device 110. Each clock signal may be operable to oscillate between a high state and a low state, and may support coordination (e.g., in time) between actions of the host device 105 and the memory device 110. In some examples, the clock signal may be single ended. In some examples, the clock signal may provide a timing reference for command and addressing operations for the memory device 110, or other system-wide operations for the memory device 110. A clock signal therefore may be referred to as a control clock signal, a command clock signal, or a system clock signal. A system clock signal may be generated by a system clock, which may include one or more hardware components (e.g., oscillators, crystals, logic gates, transistors).

In some examples, the channels 115 may include one or more data (DQ) channels 190. The data channels 190 may be operable to communicate one or more of data or control information between the host device 105 and the memory device 110. For example, the data channels 190 may communicate information (e.g., bi-directional) to be written to the memory device 110 or information read from the memory device 110.

In some examples the channels 115 may include one or more error detection code (EDC) channels 192. The EDC channels 192 may be operable to communicate error detection signals, such as checksums, to improve system reliability. An EDC channel 192 may include any quantity of signal paths. In some examples, as described with reference to FIGS. 3 and 4, an EDC channel 192 may be operable to communicate interrupts or other signals related to health status information.

Additionally or alternatively, in some examples, the channels 115 may include one or more interrupt channels 194. Interrupt channels 194 may be operable to communicate (e.g., dedicated to communicating) interrupts, which may be signals that trigger a host device 105 or a memory device 110 to alter a sequence of operations that the host device 105 or the memory device 110 would otherwise execute. For instance, as described herein, the memory device 110 may transmit a signal via interrupt channel 194 that triggers the host device 105 to transmit a request for the health status information to the memory device 110.

In some examples, the channels 115 may include one or more Joint Test Action

Group (JTAG) channels 196. The JTAG channels 196 may be operable to transmit signals according to the JTAG standard (e.g., Institute of Electrical and Electronics Engineers (IEEE) 1149.X). The JTAG channel 196 may include any quantity of signal paths. In some examples, as described with reference to FIGS. 3 and 4, the JTAG channel 196 may be operable to communicate health status information.

The channels 115 may include any quantity of signal paths (including a single signal path). In some examples, a channel 115 may include multiple individual signal paths. For example, a channel may be ×4 (e.g., including four signal paths), ×8 (e.g., including eight signal paths), ×16 (including sixteen signal paths), etc.

In some examples, system 100 may include multiple memory devices 110 configured to communicate with a host device 105. The host device 105 may have respective channels 115 for each memory device 110 (e.g., a respective C/A channel 186 for each memory device 110, a respective DQ channel 190 for each memory device, and so on). Additionally, the host device 105 may include or act as an external memory controller 120 for each memory device 110. In either case, an external memory controller 120 may manage the operations or configurations of system 100 based on health status information (e.g., as described with reference to FIGS. 3 and 4) received from the one or more memory devices 110 coupled with the external memory controller 120.

Figure 2:
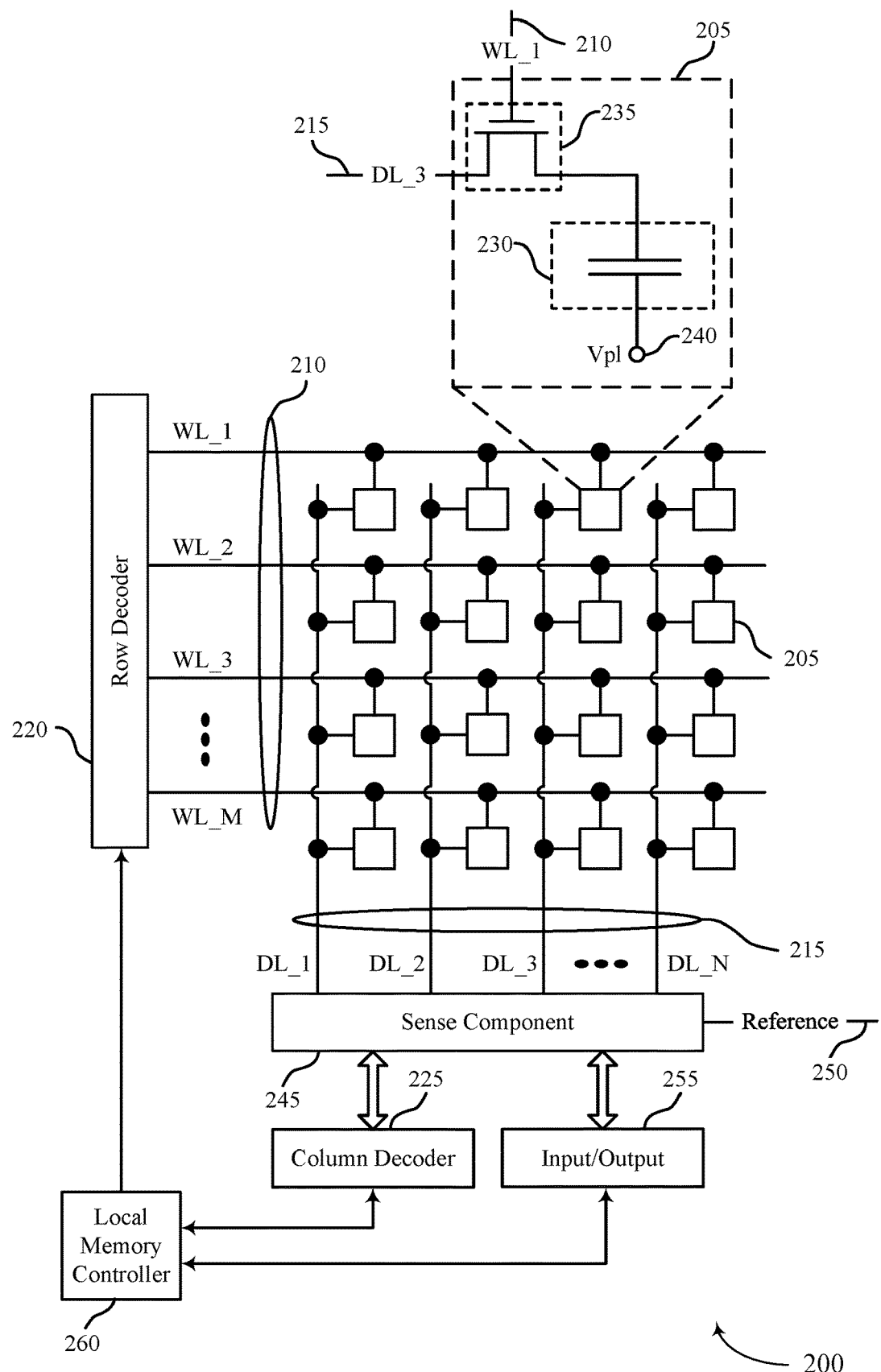
FIG. 2 illustrates an example of a memory die that supports memory health status reporting in accordance with examples as disclosed herein.

FIG. 2 illustrates an example of a memory die 200 in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., a programmed one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11).

A memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cell 205 may include a logic storage component, such as capacitor 230 and a switching component 235. The capacitor 230 may be an example of a dielectric capacitor or a ferroelectric capacitor. A node of the capacitor 230 may be coupled with a voltage source 240, which may be the cell plate reference voltage, such as Vpl, or may be ground, such as Vss.

The memory die 200 may include one or more access lines (e.g., one or more word lines 210 and one or more digit lines 215) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, or bit lines, or their analogues, are interchangeable without loss of understanding or operation. Memory cells 205 may be positioned at intersections of the word lines 210 and the digit lines 215.

Operations such as reading and writing may be performed on the memory cells 205 by activating or selecting access lines such as one or more of a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in either a two-dimensional or three-dimensional configuration may be referred to as an address of a memory cell 205.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address.

Selecting or deselecting the memory cell 205 may be accomplished by activating or deactivating the switching component 235 using a word line 210. The capacitor 230 may be coupled with the digit line 215 using the switching component 235. For example, the capacitor 230 may be isolated from digit line 215 when the switching component 235 is deactivated, and the capacitor 230 may be coupled with digit line 215 when the switching component 235 is activated.

The sense component 245 may be operable to detect a state (e.g., a charge) stored on the capacitor 230 of the memory cell 205 and determine a logic state of the memory cell 205 based on the stored state. The sense component 245 may include one or more sense amplifiers to amplify or otherwise convert a signal resulting from accessing the memory cell 205. The sense component 245 may compare a signal detected from the memory cell 205 to a reference 250 (e.g., a reference voltage). The detected logic state of the memory cell 205 may be provided as an output of the sense component 245 (e.g., to an input/output 255), and may indicate the detected logic state to another component of a memory device that includes the memory die 200.

The local memory controller 260 may control the accessing of memory cells 205 through the various components (e.g., row decoder 220, column decoder 225, sense component 245). The local memory controller 260 may be an example of the local memory controller 165 described with reference to FIG. 1. In some examples, one or more of the row decoder 220, column decoder 225, and sense component 245 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 260 may generate row signals and column address signals to activate the target word line 210 and the target digit line 215. The local memory controller 260 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. The local memory controller 260 may be operable to perform other access operations not listed here or other operations related to the operating of the memory die 200 that are not directly related to accessing the memory cells 205.

In some cases, memory die 200 may deteriorate or may be subjected to conditions that may accelerate or promote the deterioration of memory die 200. For instance, if a temperature or a voltage of memory die 200 or of one of its components exceeds a threshold, memory die 200 may be damaged. Additionally or alternatively, a PLL of memory die 200 going out of lock, a fuse of memory die 200 blowing, or a rate of error corrections performed by memory die 200 may indicate that memory die 200 is failing or has a heightened risk of failure. Such issues may trigger the memory die 200 or a memory device 110 including it to transmit an interrupt signal to a host device 105. The interrupt signal may trigger the host device 105 to perform steps to determine a health status of memory device 110. Such steps may be described with reference to FIGS. 3 and 4.

Figure 3:
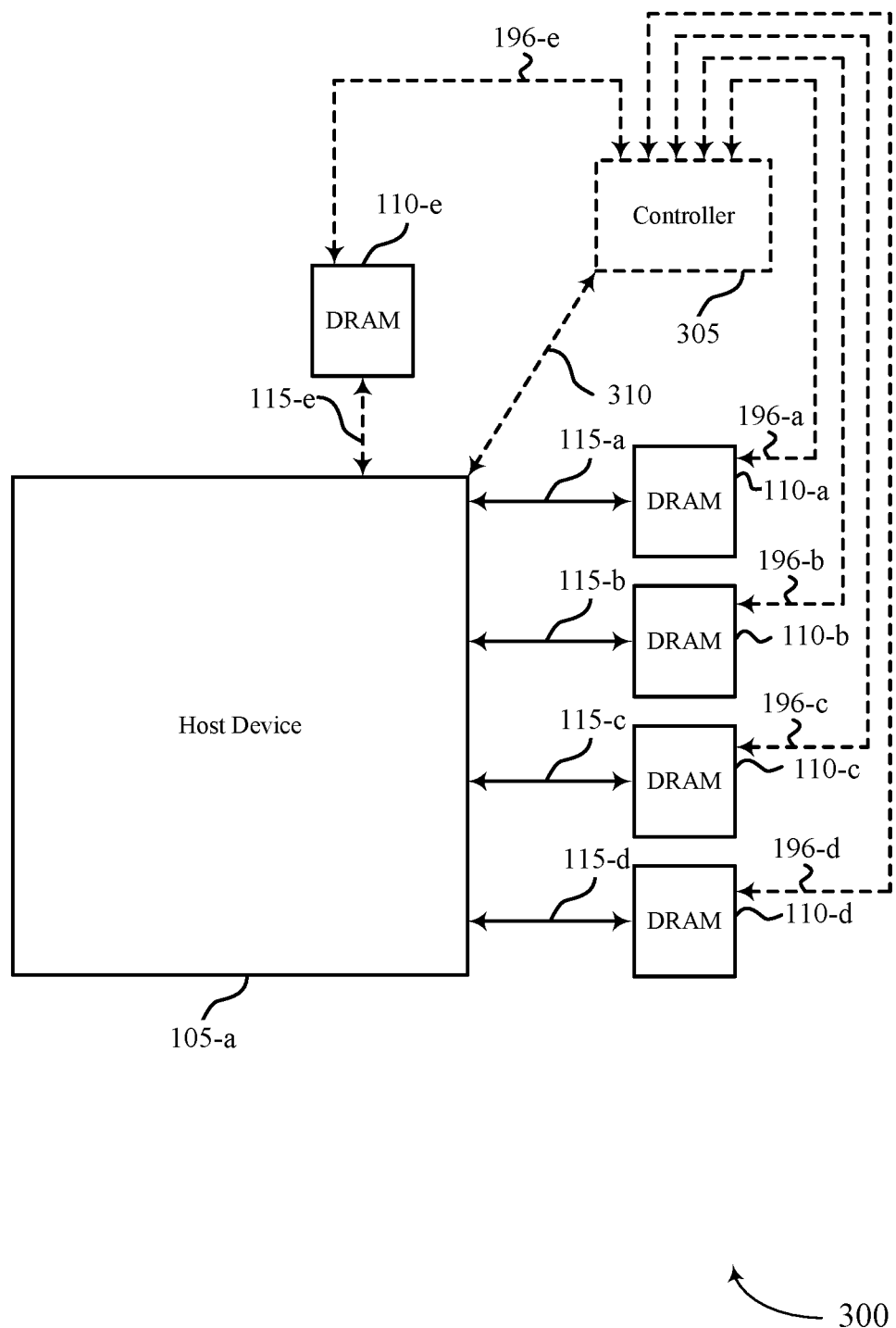
FIG. 3 illustrates an example of a system configuration that supports memory health status reporting in accordance with examples as disclosed herein.

FIG. 3 illustrates an example of a system 300 that supports memory health status reporting in accordance with examples as disclosed herein. Host device 105-a may be an example of a host device 105 as described with reference to FIG. 1 and memory devices 110-*a*, 110-*b*, 110-*c*, 110-*d*, and 110-*e* may be examples of memory devices 110 as described with reference to FIG. 1. Host device 105-*a* may communicate with memory devices 110-*a*, 110-*b*, 110-*c*, 110-*d*, and 110-*e* via channels 115-*a*, 115-*b*, 115-*c*, 115-*d*, and 115-*e*, respectively, as described with reference to FIG. 1. The channels 115 may each include a set of one or more signaling channels, including one or more of a CA channel 186, a DQ channel 190, an EDC channel 192, an interrupt channel 194, or any combination thereof.

In some cases, a controller 305 may be present separate from the host device 105-*a*. The controller 305 may communicate with memory devices 110-*a*, 110-*b*, 110-*c*, 110-*d*, and 110-*e* via JTAG channels 196-*a*, 196-*b*, 196-*c*, 196-*d*, and 196-*e*, respectively. In such cases, channels 115-*a*, 115-*b*, 115-*c*, 115-*d*, and 115-*e* may not include JTAG channels 196. In some cases, the controller 305 may be capable of communicating with host device 105-*a* via interface 310. In some cases, the controller 305 may be a JTAG controller. Alternatively, the controller 305 may be integrated (included) in host device 105-*a;* in such cases, actions ascribed herein to the controller may be performed by the host device 105-*a*, and the host device may communicate direction with the memory devices 110 over JTAG channels 196.

In some examples, host device 105-*a* or controller 305 may receive an indication of a health status or condition from one of the memory devices 110. The health status may be an indication of values of one or more parameters that indicate how well the memory device is operating. More details about the health status may be described with reference to FIG. 4. The indication of the health status may be received via EDC channel 192 (e.g., for host device 105-*a*), via a JTAG channel 196 (e.g., for host device 105-*a* or controller 305), or via a dedicated interrupt channel, among other examples.

In some examples, host device 105-*a* may poll a memory device 110 to transmit the health status or configure the memory device 110 to transmit the health status according to a schedule (e.g., a periodic schedule). For instance, the host device 105-*a* may transmit, to memory device 110-*a* via one of the channels 115-*a* (e.g., over a JTAG channel 196), a request to provide an indication of a health status. Alternatively, the host device 105-*a* may transmit the request to controller 305, or configure the controller 350 to poll the memory device 110 according to a schedule (e.g., a periodic schedule), which may transmit a corresponding request in turn to memory device 110-*a* via JTAG channel 196-*a*. In either case, memory device 110-*a* may transmit the indication of the health status once or may do so multiple times (e.g., as a burst or stream). If doing so multiple times in response to a single request, single scheduled occurrence, or single event trigger, the memory device 110 may transmit a set quantity of health status updates (e.g., an amount indicated in the request or preconfigured at the memory device 110) or may continue to transmit health status updates until host device 105-*a* or controller 305 transmit a request for memory device 110 to cease transmitting health status updates. In some examples, a memory device 110 may transmit an interrupt signal (e.g., via an interrupt channel 194) that triggers the host device 105-*a* to transmit the request (e.g., directly to the memory device 110 or via the controller 305).

If host device 105-*a* determines, upon receiving a health status, that the health status indicates that a memory device 110 is degraded (e.g., a parameter has crossed a threshold) or that a risk of failure is heightened (e.g., above a threshold), host device 105-*a* may perform one or more corrective actions, as described below. Host device 105-*a* determining that the health status indicates that the memory device 110 is degraded or that the risk of failure is heightened may involve host device 105-*a* determining that one or more values of the one or more parameters have crossed respective thresholds. More details of how the health status may indicate that the memory device 110 may be degraded or that the risk of failure is heightened may be described with reference to FIG. 4.

In one example, host device 105-*a* may initially be configured to communicate with memory devices 110-*a*, 110-*b*, 110-*c*, and 110-*d*. At a later time, host device 105-*a* may receive a health status from memory device 110-*a* that indicates that memory device 110-*a* is degraded or that a risk of failure is heightened. Host device 105-*a* may receive the health status via one of channels 115-*a* (e.g., an EDC channel 192, JTAG channel 196, or a dedicated interrupt channel) or via interface 310 (e.g., from controller 305). Upon determining that memory device 110-*a* is degraded or that the risk of failure is heightened, memory device 110-*a* may perform one or more corrective actions.

One example corrective action that host device 105-*a* may perform may be to quarantine the memory device 110-*a*. Quarantining may involve host device 105-*a* discontinuing communications with memory device 110-*a*. Although host device 105-*a* may discontinue communications with memory device 110-*a*, host device 105-*a* may maintain communications with other memory devices 110 (e.g., memory devices 110-*b*, 110-*c*, and 110-*d*). In some cases, host device 105-*a* may transfer at least some data from memory device 110-*a* to one or more memory devices 110 (e.g., memory devices 110-*b*, 110-*c*, 110-*d*, or any combination) before discontinuing communications. For instance, host device 105-*a* may read data from memory device 110-*a* and may write the data to memory device 110-*b*. Host device may determine whether to transfer data from memory device 110-*a* to one or more other memory devices 110 before discontinuing communications based on a severity (e.g., above or below a threshold) or type of degradation of memory device 110-*a*, as some types or some severities of conditions may indicate that data retrieved from memory device 110-*a* may be unreliable.

Another example corrective action that host device 105-*a* may perform may be to deactivate the memory device 110-*a*. Similar to the first corrective action, host device 105-*a* may transfer at least some data from memory device 110-*a* to one or more memory devices 110 before deactivating the memory device 110-*a*.

Another example corrective action that host device 105-*a* may perform may be to swap the memory device 110-*a* for another memory device 110. In some cases, this may include activating memory device 110-*e*, which may have previously been deactivated (e.g., configured as a backup or spare memory device 110). For instance, host device 105-*a* may initiate communications with memory device 110-*e* and may transfer at least some data from memory device 110-*a* to memory device 110-*e*. Any two or more corrective actions may be performed in combination. For instance, host device 105-*a* may discontinue communications with or deactivate the memory device 110-*a* after initiating communications with memory device 110-*e*.

Another example corrective action that the host device 105-*a* may perform may be to transmit, in response to receiving the health status, an indication of an adjustment for a parameter for memory device 110-*a*. Memory device 110-*a* may adjust a value of the parameter based on the indication and may operate based on the adjusted value of the parameter.

Generally, performing these corrective actions may support the system including host device 105-*a* and the memory devices 110 to avoid or mitigate the impact of a failure of or at a memory device 110. For instance, the first and second corrective actions may prevent host device 105-*a* from relying on memory devices 110 which have failed or have a heightened risk of failure, which may increase the reliability of the system. Additionally, transferring data, as demonstrated in the first, second, and third corrective actions, may support the host device 105-*a* continuing to have access to the data that a failing memory device 110 may have stored. Adjusting the parameter as demonstrated in the fourth corrective action may delay or prevent a failure of a memory device 110 by setting the memory device 110 into a state (e.g., to operate according to one or more adjusted parameters) in which it is less likely to fail.

Figure 4:
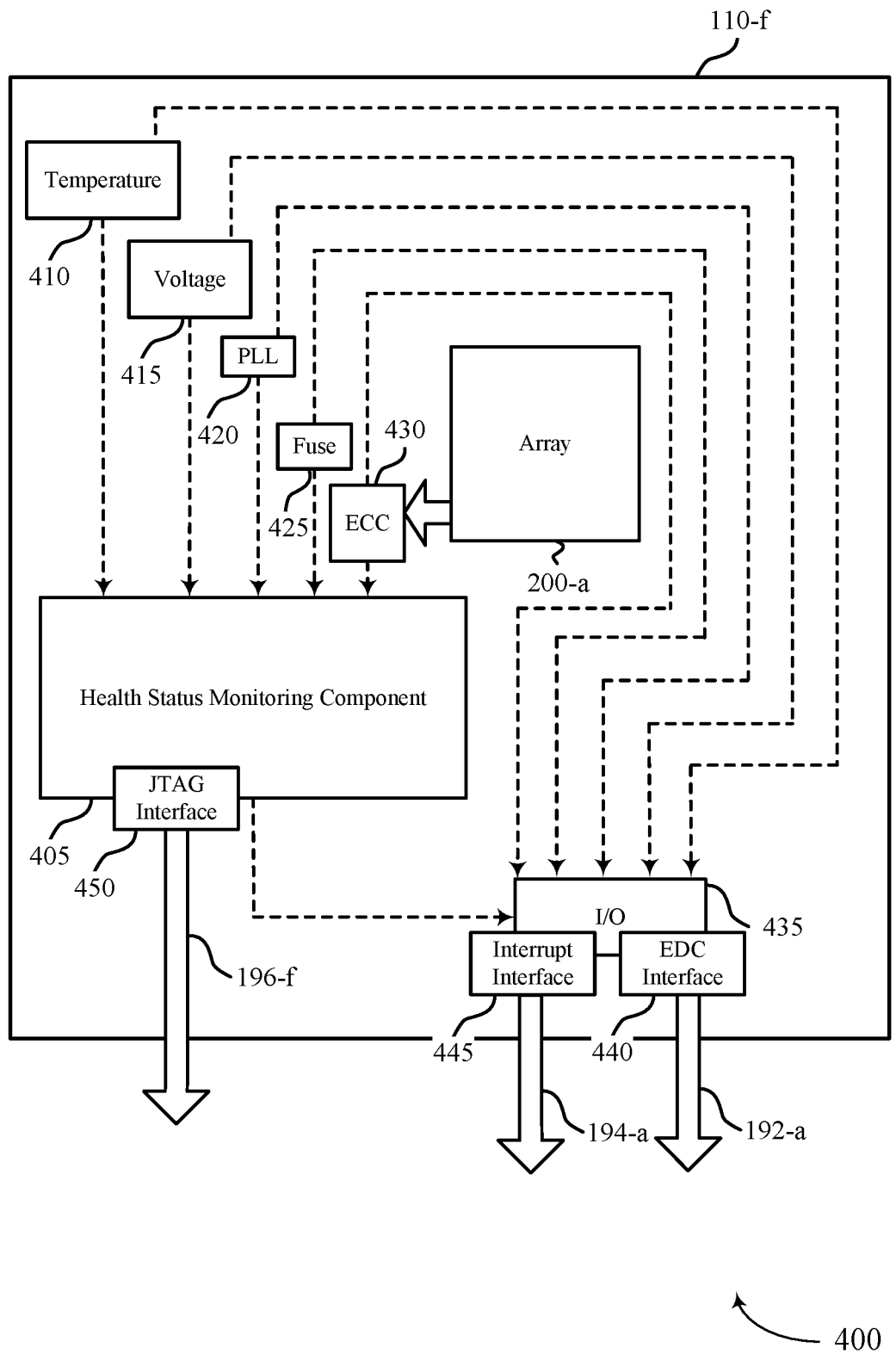
FIG. 4 illustrates an example of a memory system component diagram that supports memory health status reporting in accordance with examples as disclosed herein.

FIG. 4 illustrates an example of a memory system component diagram 400 that supports memory health status reporting in accordance with examples as disclosed herein. In some cases, the memory system of memory system component diagram 400 may be a memory device 110-*f*. Memory device 110-*f* may be an example of a memory device 110 as described with reference to FIG. 1.

Memory device 110-*f* may include a health status monitoring component 405 that may be configured to receive signaling from any number of condition detection (monitoring) components. Such detection components may include, for example, a temperature detector 410, a voltage detector 415, a PLL detector 420, a fuse detector 425, and an error correcting code (ECC) detector 430. The health status monitoring component 405 may evaluate information received from detection component (e.g., compare reported parameter values to one or more corresponding thresholds) and in some cases also store information related to the other detection components (e.g., values of parameters detected by each detector) for reporting by the memory device 110-*f* (e.g., to a host device 105 for memory device 110-*f*).

The temperature detector 410 may detect a temperature of memory device 110-*f* or of one or more of its components. Temperature detector 410 may report each temperature it detects to health status monitoring component 405. If a reported temperature is above a first threshold or below a second threshold, health status monitoring component 405 may report the temperature, a flag indicating that memory device 110-*f* is non-operable, or an interrupt trigger to input/output (I/O) 435. In some cases, memory device 110-*f* may receive the first or second threshold from a host device 105. Alternatively, health status monitoring component 405 may report the temperature to I/O 435 according to a scheduled (e.g., periodic) basis (e.g., if polling is enabled) or upon memory device 110-*f* receiving a request for a health status. In some cases (e.g., if health status monitoring component 405 is not present), temperature detector 410 may report each temperature directly to I/O 435.

The voltage detector 415 may detect a voltage applied to memory device 110-*f* or an internal voltage associated with one or more of its components (e.g., a supply voltage applied to memory device 110-*f*, or applied to a memory die 200 of memory device 110-*f*, or output by one or more drivers or associated with one or more signaling lines with memory device 110-*f*). Voltage detector 415 may report each voltage it detects to health status monitoring component 405. If a reported voltage is above a first threshold or below a second threshold, health status monitoring component 405 may report the voltage, a flag indicating that memory device 110-*f* is non-operable, or an interrupt trigger to I/O 435. In some cases, memory device 110-*f* may receive the first or second threshold from a host device 105. Alternatively, health status monitoring component 405 may report the voltage to I/O 435 according to a periodic basis (e.g., if polling is enabled) or upon memory device 110-*f* receiving a request for a health status. In some cases (e.g., if health status monitoring component 405 is not present), voltage detector 415 may report each voltage directly to I/O 435.

The PLL detector 420 may detect a status of a PLL internal to the memory device 110-*f*. Generally, the status of the PLL may indicate whether or to which degree the memory device maintains synchronization. PLL detector 420 may report the status to health status monitoring component 405. If a reported status indicates that a PLL is out of lock, the health status monitoring component 405 may report the status of the PLL, a flag indicating that memory device 110-*f* is non-operable, or an interrupt trigger to I/O 435. Alternatively, health status monitoring component 405 may report the status of the PLL to I/O 435 according to a periodic basis (e.g., if polling is enabled) or upon memory device 110-*f* receiving a request for a health status. In some cases (e.g., if health status monitoring component 405 is not present), PLL detector 420 may report the status of the PLL to I/O 435.

The fuse detector 425 may detect a status of one or more fuses internal to memory device 110-*f*. Fuse detector 425 may report the status to health status monitoring component 405. If a reported status indicates that one or more fuses is blown, the health status monitoring component 405 may report the status of the one or more fuses, a flag indicating that memory device 110-*f* is non-operable, or an interrupt trigger to I/O 435. Alternatively, health status monitoring component 405 may report the status of the one or more fuses to I/O 435 according to a periodic basis (e.g., if polling is enabled) or upon memory device 110-*f* receiving a request for a health status. In some cases (e.g., if health status monitoring component 405 is not present), fuse detector 425 may report the status of the one or more fuses to I/O 435.

The ECC detector 430 may detect a rate or count (quantity) of error corrections performed by memory device 110-*f* or one or more of its components (e.g., memory die 200-*a*). ECC detector 430 may report the rate or count of error corrections to health status monitoring component 405. If the rate or count of error corrections is above a threshold, the health status monitoring component 405 may report the rate or count of error corrections, a flag indicating that memory device 110-*f* is non-operable, or an interrupt trigger to I/O 435. In some cases, memory device 110-*f* may receive the threshold from a host device 105. In some cases (e.g., if health status monitoring component 405 is not present), ECC detector may report the rate of error corrections to I/O 435.

In some cases, health status monitoring component 405 may include a JTAG interface 450. JTAG interface 450 may be configured to transmit values of parameters corresponding to a health status (e.g., a temperature, a voltage, a PLL status, a fuse status, a rate of error corrections, a non-operability flag, or any combination thereof) to a host device 105 or a controller 305 via JTAG channel 196-*f*. It should be noted that there may examples where I/O includes a JTAG interface 450 instead of health status monitoring component 405 and/or examples where health status monitoring component 405 includes an interrupt interface 445. In some cases, health status monitoring component 405 may be configured to generate a non-operability flag based on any number of health status parameters provided by a detection component being beyond a threshold, which may be more extreme (e.g., higher or lower) than other threshold(s) associated with the parameter.

In some cases, I/O 435 may include an EDC interface 440. EDC interface 440 may be configured to transmit an interrupt signal (e.g., based on the timing of the signal or information encoded into the signal) to a host device 105 via EDC channel 192-a, which may trigger the host device 105 to request one or more parameter values from the memory device (e.g., via JTAG interface 450, in some cases by way of an external JTAG controller such as controller 305 described with reference to FIG. 3). Additionally or alternatively, EDC interface 440 may be configured to transmit the health status information to the host device 105.

In some cases, I/O 435 may include an interrupt interface 445. Interrupt interface 445 may be configured (e.g., dedicated) to transmit an interrupt trigger (signal) to host device 105 via interrupt channel 194-a. The interrupt trigger may trigger a host device 105 to transmit a request for a health status to memory device 110-f (e.g., via JTAG interface 450, in some cases by way of an external JTAG controller such as controller 305 described with reference to FIG. 3).

Figure 5:
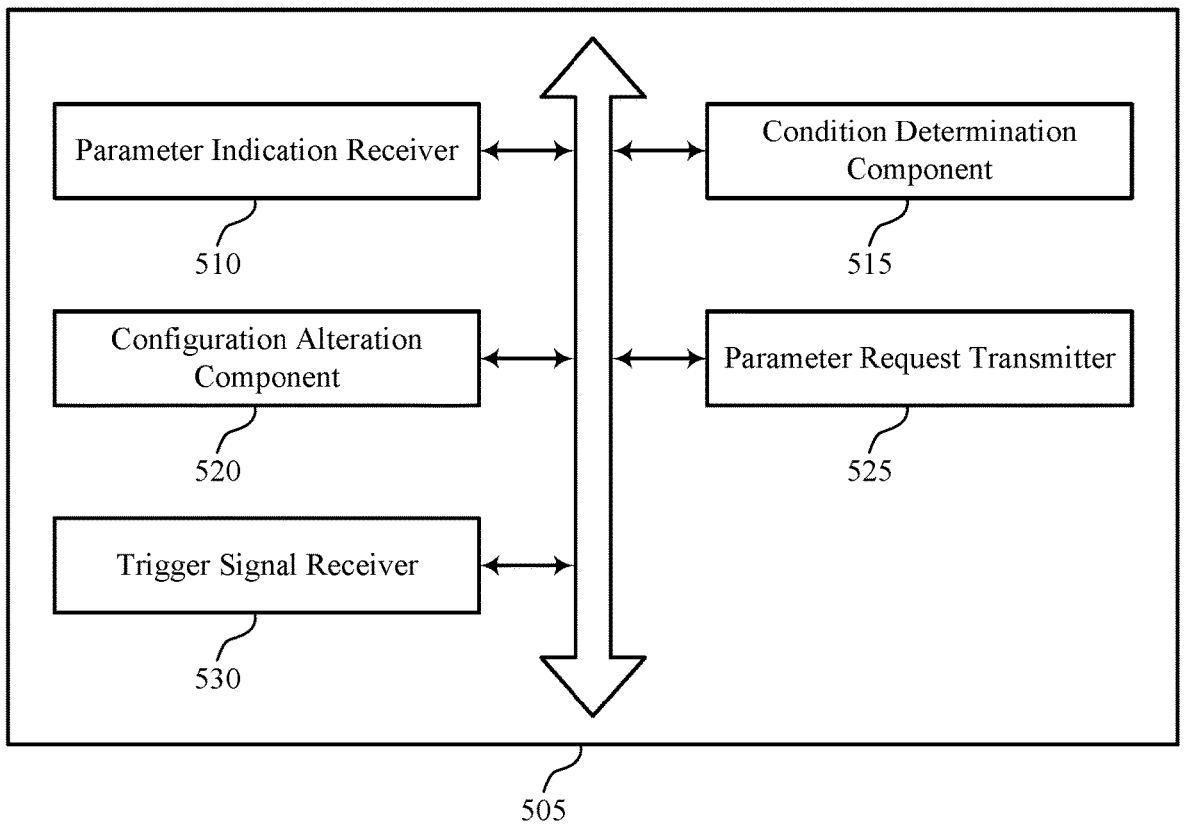
FIG. 5 shows a block diagram of a host device that supports memory health status reporting in accordance with examples as disclosed herein.

FIG. 5 shows a block diagram 500 of a host device 505 that supports memory health status reporting in accordance with examples as disclosed herein. The host device 505 may be an example of aspects of a host device 105 as described with reference to FIGS. 1 and 3. The host device 505 may include a parameter indication receiver 510, a condition determination component 515, a configuration alteration component 520, a parameter request transmitter 525, and a trigger signal receiver 530. Each of these modules may communicate, directly or indirectly, with one another (e.g., via one or more buses).

The parameter indication receiver 510 may receive an indication of a value of a parameter for a memory device. In some cases, the indication is received via a Joint Test Action Group (JTAG) interface. In some cases, the indication is received via a data (DQ) bus. In some cases, the parameter includes an operability status of the memory device. In some cases, the parameter includes a voltage internal to the memory device. In some cases, the parameter includes a status of a PLL internal to the memory device. In some cases, the parameter includes a temperature of the memory device. In some cases, the parameter includes a status of a fuse internal to the memory device. In some cases, the parameter includes a rate of error corrections performed by the memory device.

The condition determination component 515 may determine, based on the value of the parameter, a condition of the memory device. In some examples, the condition determination component 515 may compare the value of the parameter to a threshold, where determining the condition of the memory device is based on the comparing. In some examples, determining the condition of the memory device includes determining that the memory device is inoperable. In some examples, determining the condition of the memory device includes determining that the voltage is outside of a range. In some examples, determining the condition of the memory device includes determining that the PLL is out of lock. In some examples, determining the condition of the memory device includes determining that the temperature is outside of a range. In some examples, determining the condition of the memory device includes determining that the fuse is blown. In some examples, determining the condition of the memory device includes determining that the rate of error corrections exceeds a threshold.

The configuration alteration component 520 may alter a configuration of a system that includes the memory device based on the condition of the memory device. In some examples, the configuration alteration component 520 may discontinue communications with the memory device. In some examples, the configuration alteration component 520 may activate a second memory device included in the system.

The parameter request transmitter 525 may transmit requests for values of the parameter in accordance with a schedule, where the indication of the value of the parameter is received based on a request transmitted in accordance with the schedule. In some examples, the parameter request transmitter 525 may transmit the request for the value of the parameter in response to the signal, where the indication of the value of the parameter is received based on the request.

The trigger signal receiver 530 may receive, from the memory device, a signal configured to trigger a request for the value of the parameter. In some cases, the signal configured to trigger the request is received via an Error Detection Code (EDC) pin. In some cases, the signal configured to trigger the request is received via an interrupt pin.

Figure 6:
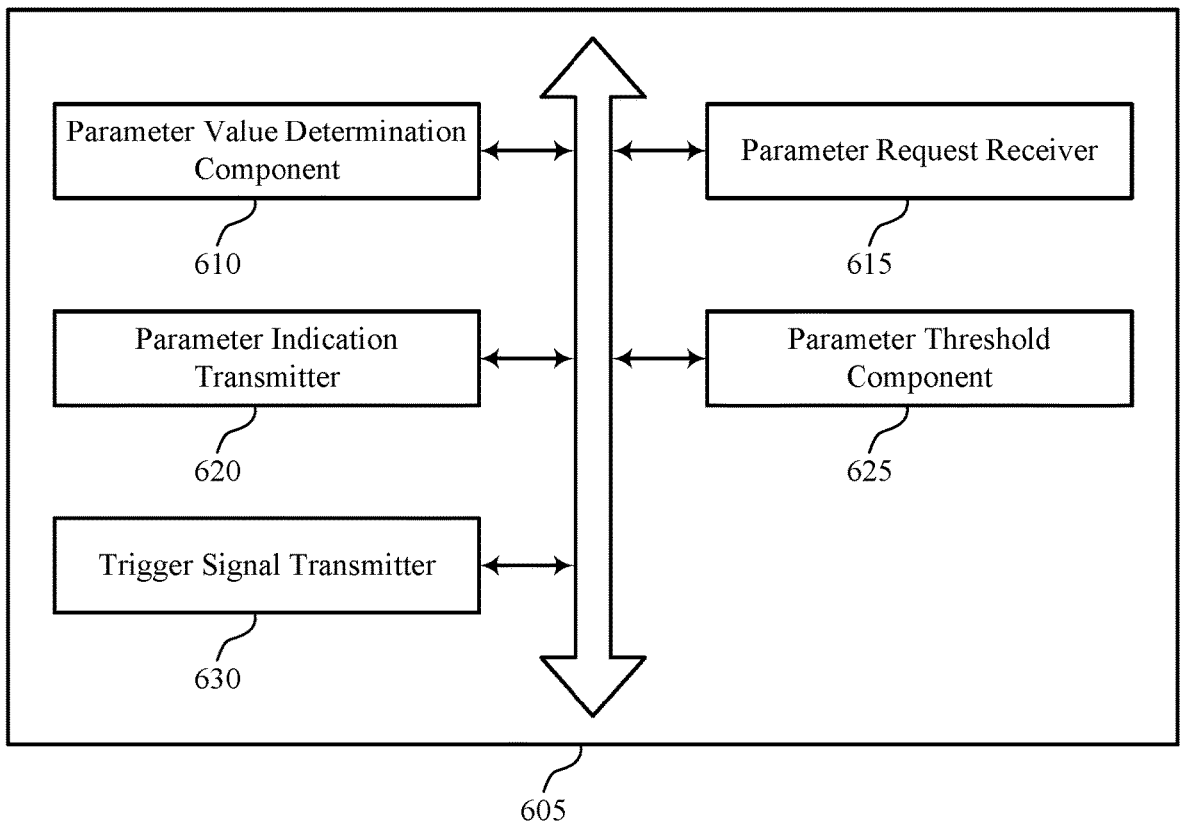
FIG. 6 shows a block diagram of a memory device that supports memory health status reporting in accordance with examples as disclosed herein.

FIG. 6 shows a block diagram 600 of a memory device 605 that supports memory health status reporting in accordance with examples as disclosed herein. The memory device 605 may be an example of aspects of a memory device 110 as described with reference to FIGS. 1 through 4. The memory device 605 may include a parameter value determination component 610, a parameter request receiver 615, a parameter indication transmitter 620, a parameter threshold component 625, and a trigger signal transmitter 630. Each of these modules may communicate, directly or indirectly, with one another (e.g., via one or more buses).

The parameter value determination component 610 may determine a value of a parameter indicative of a condition of a memory device. In some cases, the memory device is coupled with the device via a Joint Test Action Group (JTAG) interface. In some cases, the memory device is coupled with a second device via a second interface, where the second device is a host device for the memory device. In some cases, the parameter includes a voltage at the memory device, a status of a PLL within the memory device, a temperature of the memory device, a status of a fuse within the memory device, a count of error correction procedures performed by the memory device, or an operability status of the memory device.

The parameter request receiver 615 may receive a request for the value of the parameter. In some cases, the request is received via the JTAG interface.

The parameter indication transmitter 620 may transmit, based on receiving the request, an indication of the value of the parameter to a device that is external to the memory device. In some cases, the indication is transmitted via a Joint Test Action Group (JTAG) interface. In some cases, the indication is transmitted via a data (DQ) bus. In some cases, the device includes a host device for the memory device.

The parameter threshold component 625 may determine that the value of the parameter satisfies a threshold. In some examples, the parameter threshold component 625 may receive an indication of the threshold.

The trigger signal transmitter 630 may transmit, to the device, a signal configured to trigger the request for the value of the parameter, where transmitting the signal is based on determining that the value of the parameter satisfies the threshold. In some cases, the signal configured to trigger the request is transmitted via an Error Detection Code (EDC) pin. In some cases, the signal configured to trigger the request is transmitted via an interrupt pin.

Figure 7:
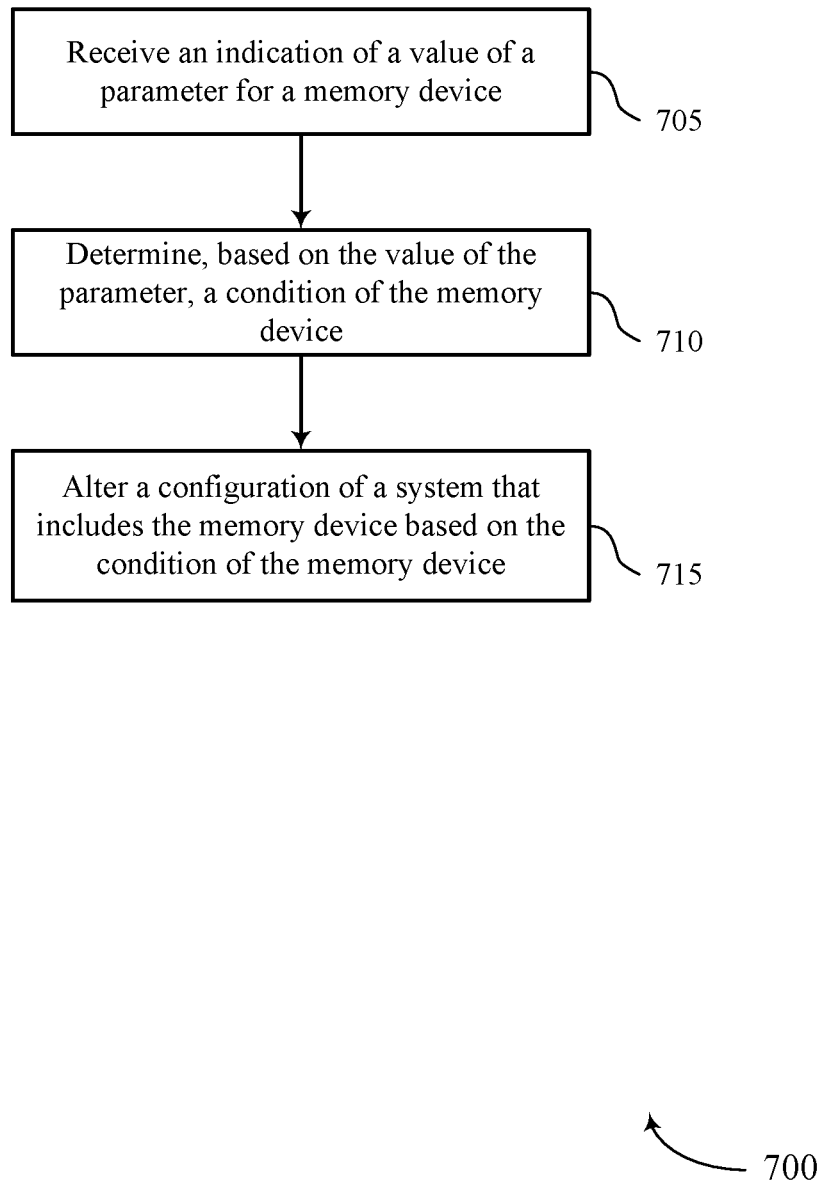
FIGS. 7 and 8 show flowcharts illustrating a method or methods for supporting memory health status reporting in accordance with examples as disclosed herein.

FIG. 7 shows a flowchart illustrating a method or methods 700 that supports memory health status reporting in accordance with examples as disclosed herein. The operations of method 700 may be implemented by a host device or its components as described with reference to FIGS. 3 and 4. For example, the operations of method 700 may be performed by a host device as described with reference to FIG. 5. In some examples, a host device may execute a set of instructions to control the functional elements of the host device to perform the described functions. Additionally or alternatively, a host device may perform aspects of the described functions using special-purpose hardware.

At 705, the host device may receive an indication of a value of a parameter for a memory device. The operations of 705 may be performed according to the methods described with reference to FIGS. 3 and 4. In some examples, aspects of the operations of 705 may be performed by a parameter indication receiver as described with reference to FIG. 5.

At 710, the host device may determine, based on the value of the parameter, a condition of the memory device. The operations of 710 may be performed according to the methods described with reference to FIGS. 3 and 4. In some examples, aspects of the operations of 710 may be performed by a condition determination component as described with reference to FIG. 5.

At 715, the host device may alter a configuration of a system that includes the memory device based on the condition of the memory device. The operations of 715 may be performed according to the methods described with reference to FIGS. 3 and 4. In some examples, aspects of the operations of 715 may be performed by a configuration alteration component as described with reference to FIG. 5.

In some examples, an apparatus as described herein may perform a method or methods, such as the method 700. The apparatus may include features, means, or instructions (e.g., a non-transitory computer-readable medium storing instructions executable by a processor) for receiving an indication of a value of a parameter for a memory device, determining, based on the value of the parameter, a condition of the memory device, and altering a configuration of a system that includes the memory device based on the condition of the memory device.

Some examples of the method 700 and the apparatus described herein may further include operations, features, means, or instructions for transmitting requests for values of the parameter in accordance with a schedule, where the indication of the value of the parameter may be received based on a request transmitted in accordance with the schedule.

Some examples of the method 700 and the apparatus described herein may further include operations, features, means, or instructions for receiving, from the memory device, a signal configured to trigger a request for the value of the parameter, and transmitting the request for the value of the parameter in response to the signal, where the indication of the value of the parameter may be received based on the request.

In some examples of the method 700 and the apparatus described herein, the signal configured to trigger the request may be received via an Error Detection Code (EDC) pin.

In some examples of the method 700 and the apparatus described herein, the signal configured to trigger the request may be received via an interrupt pin.

Some examples of the method 700 and the apparatus described herein may further include operations, features, means, or instructions for comparing the value of the parameter to a threshold, where determining the condition of the memory device may be based on the comparing.

In some examples of the method 700 and the apparatus described herein, the indication may be received via a Joint Test Action Group (JTAG) interface.

In some examples of the method 700 and the apparatus described herein, the indication may be received via a data (DQ) bus.

In some examples of the method 700 and the apparatus described herein, the parameter includes an operability status of the memory device, and determining the condition of the memory device may include operations, features, means, or instructions for determining that the memory device may be inoperable.

In some examples of the method 700 and the apparatus described herein, the parameter includes a voltage internal to the memory device, and determining the condition of the memory device may include operations, features, means, or instructions for determining that the voltage may be outside of a range.

In some examples of the method 700 and the apparatus described herein, the parameter includes a status of a PLL internal to the memory device, and determining the condition of the memory device may include operations, features, means, or instructions for determining that the PLL may be out of lock.

In some examples of the method 700 and the apparatus described herein, the parameter includes a temperature of the memory device, and determining the condition of the memory device may include operations, features, means, or instructions for determining that the temperature may be outside of a range.

In some examples of the method 700 and the apparatus described herein, the parameter includes a status of a fuse internal to the memory device, and determining the condition of the memory device may include operations, features, means, or instructions for determining that the fuse may be blown.

In some examples of the method 700 and the apparatus described herein, the parameter includes a rate of error corrections performed by the memory device, and determining the condition of the memory device may include operations, features, means, or instructions for determining that the rate of error corrections exceeds a threshold.

In some examples of the method 700 and the apparatus described herein, altering the configuration of the system may include operations, features, means, or instructions for discontinuing communications with the memory device.

In some examples of the method 700 and the apparatus described herein, altering the configuration of the system may include operations, features, means, or instructions for activating a second memory device included in the system.

Figure 8:
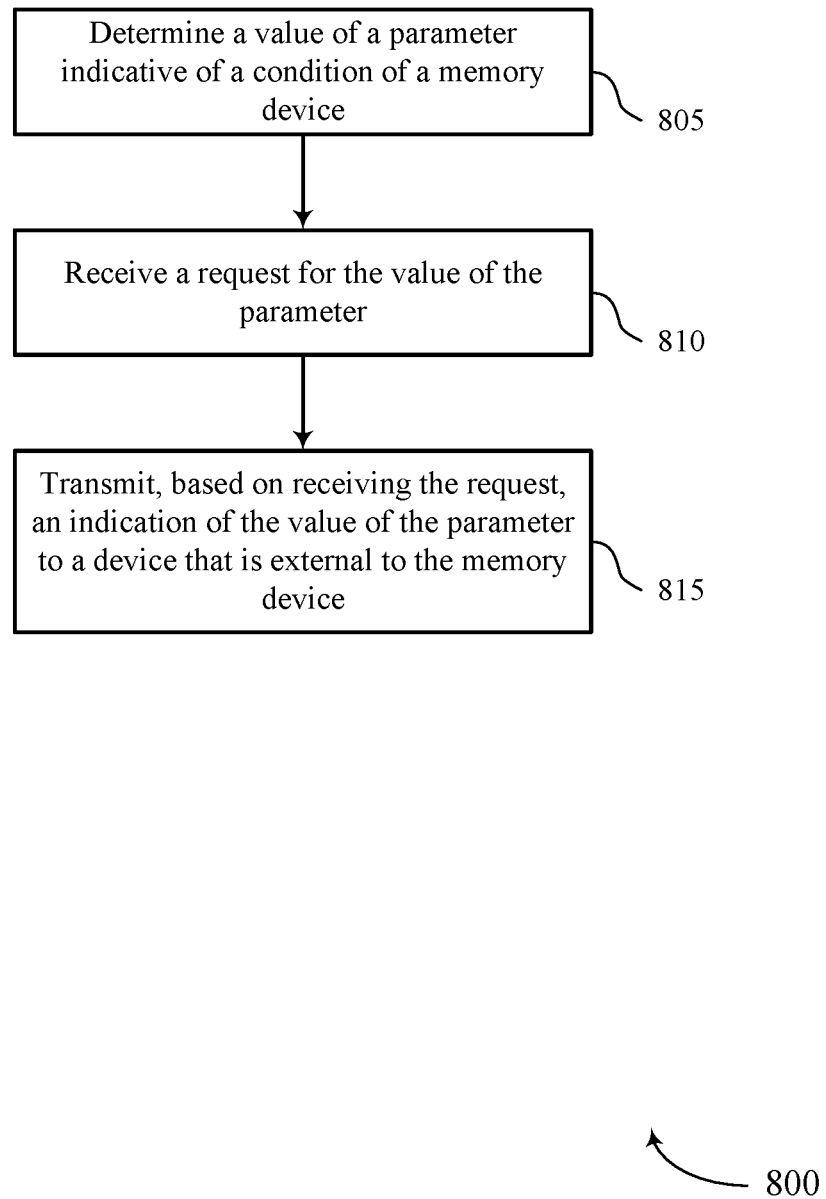

FIG. 8 shows a flowchart illustrating a method or methods 800 that supports memory health status reporting in accordance with examples as disclosed herein. The operations of method 800 may be implemented by a memory device or its components as described with reference to FIGS. 3 and 4. For example, the operations of method 800 may be performed by a memory device as described with reference to FIG. 6. In some examples, a memory device may execute a set of instructions to control the functional elements of the memory device to perform the described functions. Additionally or alternatively, a memory device may perform aspects of the described functions using special-purpose hardware.

At 805, the memory device may determine a value of a parameter indicative of a condition of a memory device. The operations of 805 may be performed according to the methods described with reference to FIGS. 3 and 4. In some examples, aspects of the operations of 805 may be performed by a parameter value determination component as described with reference to FIG. 6.

At 810, the memory device may receive a request for the value of the parameter. The operations of 810 may be performed according to the methods described with reference to FIGS. 3 and 4. In some examples, aspects of the operations of 810 may be performed by a parameter request receiver as described with reference to FIG. 6.

At 815, the memory device may transmit, based on receiving the request, an indication of the value of the parameter to a device that is external to the memory device. The operations of 815 may be performed according to the methods described with reference to FIGS. 3 and 4. In some examples, aspects of the operations of 815 may be performed by a parameter indication transmitter as described with reference to FIG. 6.

In some examples, an apparatus as described herein may perform a method or methods, such as the method 800. The apparatus may include features, means, or instructions (e.g., a non-transitory computer-readable medium storing instructions executable by a processor) for determining a value of a parameter indicative of a condition of a memory device, receiving a request for the value of the parameter, and transmitting, based on receiving the request, an indication of the value of the parameter to a device that is external to the memory device.

Some examples of the method 800 and the apparatus described herein may further include operations, features, means, or instructions for determining that the value of the parameter satisfies a threshold, and transmitting, to the device, a signal configured to trigger the request for the value of the parameter, where transmitting the signal may be based on determining that the value of the parameter satisfies the threshold.

In some examples of the method 800 and the apparatus described herein, the signal configured to trigger the request may be transmitted via an Error Detection Code (EDC) pin.

In some examples of the method 800 and the apparatus described herein, the signal configured to trigger the request may be transmitted via an interrupt pin.

Some examples of the method 800 and the apparatus described herein may further include operations, features, means, or instructions for receiving an indication of the threshold.

In some examples of the method 800 and the apparatus described herein, the indication may be transmitted via a Joint Test Action Group (JTAG) interface.

In some examples of the method 800 and the apparatus described herein, the request may be received via the JTAG interface.

In some examples of the method 800 and the apparatus described herein, the indication may be transmitted via a data (DQ) bus.

In some examples of the method 800 and the apparatus described herein, the device includes a host device for the memory device.

In some examples of the method 800 and the apparatus described herein, the memory device may be coupled with the device via a Joint Test Action Group (JTAG) interface, and the memory device may be coupled with a second device via a second interface, where the second device may be a host device for the memory device.

In some examples of the method 800 and the apparatus described herein, the parameter includes a voltage at the memory device, a status of a PLL within the memory device, a temperature of the memory device, a status of a fuse within the memory device, a count of error correction procedures performed by the memory device, or an operability status of the memory device.

It should be noted that the methods described above describe possible implementations, and that the operations and the steps may be rearranged or otherwise modified and that other implementations are possible. Further, portions from two or more of the methods may be combined.

A system is described. The system may include a host device and a memory device coupled with the host device, where the memory device is operable to: exchange data with the host device; determine, after exchanging data with the host device, a value of a parameter that indicates a condition of the memory device; and transmit an indication of the value of the parameter to a device that is external to the memory device.

In some examples, the host device may be operable to deactivate the memory device based at least in part on the value of the parameter. In some examples, the system may further include a second memory device, where based at least in part on the value of the parameter, the host device is operable to discontinue communications with the memory device while maintaining communications with the second memory device. In some examples, the system may further include a second memory device, where based at least in part on the value of the parameter, the host device is operable to read data from the memory device and write the data to the second memory device. In some examples, the system may further include a second memory device, where based at least in part on the value of the parameter, the host device is operable to initiate communications with the second memory device.

In some examples, the memory device includes a Joint Test Action Group (JTAG) interface and is operable to transmit the value of the parameter to the device via the JTAG interface. In some examples, the device includes a controller coupled with the memory device via the JTAG interface and coupled with the host device via a second interface, where the controller is operable to receive the indication of the value of the parameter via the JTAG interface and transmit, in response to receiving the indication, a second indication of the value of the parameter to the host device via the second interface. In some examples, the host device is operable to transmit, in response to the indication of the value of the parameter, an indication of an adjustment for a second parameter for the memory device and the memory device is operable to: adjust a value of the second parameter based at least in part on the indication of the adjustment and operate based at least in part on the adjusted value of the second parameter.

In some examples, the device is the host device. In some examples, the parameter includes a voltage at the memory device, a status of a PLL within the memory device, a temperature of the memory device, a status of a fuse within the memory device, a count of error correction procedures performed by the memory device, or an operability status of the memory device. In some examples, the condition comprises a health status for the memory device.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A system, comprising:
a host device; and
a memory device coupled with the host device, wherein the memory device is operable to:
exchange data with the host device;
determine, after exchanging data with the host device, a value of a parameter that indicates a health status associated with operability of the memory device;
transmit, via a via a Joint Test Action Group (JTAG) interface of the memory device, an indication of the value of the parameter to a device that is different than the host device and external to the memory device, wherein the host device is operable to alter a configuration of the system based at least in part on the health status associated with operability of the memory device, and wherein the device comprises a controller that is coupled with the memory device via the JTAG interface of the memory device and is coupled with the host device via a second interface, and wherein the controller is operable to:
receive the indication of the value of the parameter via the JTAG interface; and
transmit, in response to receiving the indication, a second indication of the value of the parameter to the host device via the second interface;
receive, from the host device in response to the indication of the value of the parameter, an indication of an adjustment for a second parameter for the memory device;
adjust a value of the second parameter based at least in part on the indication of the adjustment; and
operate based at least in part on the adjusted value of the second parameter.

2. The system of claim 1, wherein the host device is operable to:
deactivate the memory device based at least in part on the value of the parameter.

3. The system of claim 1, further comprising:
a second memory device, wherein based at least in part on the value of the parameter, the host device is operable to discontinue communications with the memory device while maintaining communications with the second memory device.

4. The system of claim 1, further comprising:
a second memory device, wherein based at least in part on the value of the parameter, the host device is operable to:
read data from the memory device; and
write the data to the second memory device.

5. The system of claim 1, further comprising:
a second memory device, wherein based at least in part on the value of the parameter, the host device is operable to initiate communications with the second memory device.

6. The system of claim 1, wherein the parameter comprises a voltage at the memory device, a status of a phase-locked loop (PLL) within the memory device, a temperature of the memory device, a status of a fuse within the memory device, a count of error correction procedures performed by the memory device, or an operability status of the memory device.

7. A method, comprising:
receiving, from a memory device, an indication of a value of a parameter for the memory device;
determining, based at least in part on the value of the parameter, a health status associated with operability of the memory device;
transmitting, to the memory device in response to the indication of the value of the parameter, an indication of an adjustment for a second parameter for the memory device, wherein the indication of the adjustment for the second parameter corresponds to an adjusted value of the second parameter for subsequent operations by the memory device; and
altering a configuration of a system that includes the memory device and one or more other memory devices based at least in part on the health status associated with operability of the memory device.

8. The method of claim 7, further comprising:
transmitting requests for values of the parameter in accordance with a schedule, wherein the indication of the value of the parameter is received based at least in part on a request transmitted in accordance with the schedule.

9. The method of claim 7, further comprising:
receiving, from the memory device, a signal configured to trigger a request for the value of the parameter; and
transmitting the request for the value of the parameter in response to the signal, wherein the indication of the value of the parameter is received based at least in part on the request.

10. The method of claim 9, wherein:
the signal configured to trigger the request is received via an Error Detection Code (EDC) pin; or
the signal configured to trigger the request is received via an interrupt pin.

11. The method of claim 7, further comprising:
comparing the value of the parameter to a threshold, wherein determining the health status of the memory device is based at least in part on the comparing.

12. The method of claim 7, wherein:
the indication is received via a Joint Test Action Group (JTAG) interface; or
the indication is received via a data (DQ) bus.

13. The method of claim 7, wherein:
the parameter comprises an operability status of the memory device; and
determining the health status of the memory device comprises determining that the memory device is inoperable.

14. The method of claim 7, wherein:
the parameter comprises a voltage internal to the memory device; and
determining the health status of the memory device comprises determining that the voltage is outside of a range.

15. The method of claim 7, wherein:
the parameter comprises a status of a phase lock loop (PLL) internal to the memory device; and
determining the health status of the memory device comprises determining that the PLL is out of lock.

16. The method of claim 7, wherein:
the parameter comprises a temperature of the memory device; and
determining the health status of the memory device comprises determining that the temperature is outside of a range.

17. The method of claim 7, wherein:
the parameter comprises a status of a fuse internal to the memory device; and
determining the health status of the memory device comprises determining that the fuse is blown.

18. The method of claim 7, wherein:
the parameter comprises a rate of error corrections performed by the memory device; and
determining the health status of the memory device comprises determining that the rate of error corrections exceeds a threshold.

19. A method, comprising:
determining a value of a parameter indicative of a health status associated with operability of a memory device;
receiving, from a host device, a request for the value of the parameter indicative of the health status associated with operability of the memory device; transmitting, via a Joint Test Action Group (JTAG) interface of the memory device based at least in part on receiving the request, an indication of the value of the parameter to a device that is external to the memory device, wherein the memory device is coupled with the device via the JTAG interface and the memory device is coupled with the host device via a second interface different than the JTAG interface;
receiving, from the host device in response to the indication of the value of the parameter, an indication of an adjustment for a second parameter for the memory device;
adjusting a value of the second parameter based at least in part on the indication of the adjustment; and
operating based at least in part on the adjusted value of the second parameter.

20. The method of claim 19, further comprising:
determining that the value of the parameter satisfies a threshold; and
transmitting, to the device, a signal configured to trigger the request for the value of the parameter, wherein transmitting the signal is based at least in part on determining that the value of the parameter satisfies the threshold.

\* \* \* \* \*